United States Patent [19]

Hinode

[11] Patent Number: 4,887,146

[45] Date of Patent: Dec. 12, 1989

[54] SEMICONDUCTOR DEVICE

[75] Inventor: Kenji Hinode, Hachioji, Japan

[73] Assignee: Hitachi, Ltd., Tokyo, Japan

[21] Appl. No.: 46,145

[22] Filed: May 5, 1987

[30] Foreign Application Priority Data

May 6, 1986 [JP] Japan .................. 61-102010

[51] Int. Cl.⁴ ................... H01L 21/283; H01L 23/54
[52] U.S. Cl. ........................ 357/71; 357/68; 357/67
[58] Field of Search .................. 357/68, 67, 71; 428/620

[56] References Cited

U.S. PATENT DOCUMENTS

| | | | |
|---|---|---|---|
| 3,701,931 | 10/1972 | Revitz et al. | 357/67 |
| 4,570,328 | 2/1986 | Price et al. | 357/71 |
| 4,574,298 | 3/1986 | Yamagishi et al. | 357/71 |
| 4,702,967 | 10/1987 | Black et al. | 428/620 |
| 4,753,851 | 6/1988 | Roberts | 428/620 |

OTHER PUBLICATIONS

Interfacial Reactions Between Aluminum and Transition Metal Nitride and Carbide Films, Wittmer–J. Appl. Phys. 53(2), Feb. 1982, pp. 1007–1012.

Tin Formed by Evaporation as a Diffusion Barrier Between Al and Si–Ting–J. Vac. Sci. Technol., May/Jun. 1982, pp. 14–18.

Primary Examiner—Rolf Hille
Assistant Examiner—S. V. Clark
Attorney, Agent, or Firm—Antonelli, Terry & Wands

[57] ABSTRACT

A semiconductor device having a TiN film serving as a barrier layer and a TiN$_x$ (0.3<X<0.9) film between a wiring layer and a semiconductor substrate is disclosed. Interposition of the TiN$_x$ film between the semiconductor substrate and the TiN film lowers the contact resistance in the contact region between the semiconductor substrate and the wiring layer and also the leakage current and improves the adhesion between the wiring layer and the semiconductor substrate, so that the characteristics and reliability of the semiconductor device are greatly improved.

17 Claims, 1 Drawing Sheet

SEMICONDUCTOR DEVICE

BACKGROUND OF THE INVENTION

The present invention relates to a semiconductor device and, more particularly, to a semiconductor device having a minute wiring which has sufficiently low contact resistance with a semiconductor substrate and considerably high reliability.

As is well known, films of Al and films of alloys containing Al as a principal component are widely employed as wirings of various kinds of semiconductor device.

However, a variety of problems have recently been experienced as the integration density of semiconductor devices becomes extremely high.

For example, as the integration density becomes higher, the source and drain regions of MOS transistors are reduced not only in area but also in depth. The source and drain regions and the above-described wirings (which may also be called source and drain electrodes) are generally connected to each other as follows. Namely, an insulator film having windows is formed on the surface of a semiconductor substrate, and an impurity is doped into surface regions of the semiconductor substrate through the windows to form source and drain regions. Then, an Al film or an Al-based alloy film is deposited so as to extend over from the surfaces of the source and drain regions to the surface of the insulator film to thereby form wirings. Al and Al-based alloy films are generally deposited by vacuum evaporation effected by means, for example, of electron beam heating. However, when Al and Al-based alloy films are deposited merely by vacuum evaporation, the adhesion of the films to the source and drain regions is weak, so that satisfactory reliability cannot be obtained. Therefore, it isessential to carry out a heat treatment after the deposition of an Al film or an Al-based alloy film in order to increase the adhesion between the deposited film and the source and drain regions. The heat treatment causes an Al-Si alloy layer to be formed at the interface between the wiring film and the semiconductor substrate (the source and drain regions), so that the wiring film and the substrate are connected together strongly and the reliability is thus improved.

However, the Al-Si alloy layer is formed through the phenomenon that Al in the wiring film moves downward and Si in the semiconductor substrate moves upward, and therefore Al undesirably enters the source and drain regions which are formed in the surface region of the semiconductor substrate.

Although the above-described phenomenon gives rise to no particularly serious problem when the integration density of the semiconductor device is relatively low and the source and drain regions have a sufficiently large depth, when the source and drain regions become extremely shallow as described above, Al entering the source and drain regions is undesirably diffused into the p-type semiconductor substrate through the pn junctions defined between the source and drain regions (n$^+$-type) and the substrate. Since Al is a p-type impurity, such diffusion of Al causes the pn junctions of the source and drain regions to be destroyed, resulting in the n$^{30}$-type source and drain regions and the p-type semiconductor substrate being undesirably electrically connected to each other.

Such a phenomenon occurs not only in the case where Al or Al-based alloy is employed as a wiring material but also in the case where W, Mo or a silicide of these metals is employed as a wiring material, thus constituting one of serious obstacles to formation of minute wirings. It is a matter of course that such a problem occurs not only in regard of the source and drain regions of MOS transistors but completely the same problem occurs in the case where wirings are connected to any other shallow impurity-doped regions.

In order to solve the above-described problem, a technique in which a TiN film is interposed as a barrier layer between a wiring layer and an impurity-doped region (a semiconductor substrate) has been proposed. Interposition of a TiN film as a barrier layer between them prevents Si from moving from the semiconductor substrate into the metal film and also prevents a metal from moving from the metal film into the semiconductor substrate even if a heat treatment is carried out after the deposition of the metal film. There is therefore no fear of the pn junction of the impurity-doped layer being destroyed, and a semiconductor device of high reliability can be formed.

However, it has been found that employment of a TiN layer as a barrier layer increases the contact resistance in the contact region between the TiN film and the surface of the semiconductor substrate (see Sollar Cells, 9 (1983), pp. 179–183), which means that the proposed technique involves a serious problem in practical use.

SUMMARY OF THE INVENTION

It is an object of the present invention to provide a semiconductor device having a wiring which has a sufficiently low contact resistance with a semiconductor substrate (an impurity-doped region) and high reliability, thereby overcoming the above-described problems of the prior art.

To this end, according to the present invention, a $TiN_x (0.3 \leq X \leq 0.9)$ layer is provided under a TiN layer (one in which the ratio of Ti to N in terms of the number of atoms is 1:1), and the contact resistance in the contact region between the wiring and the semiconductor substrate is thereby lowered without impairing the reliability.

DETAILED DESCRIPTION OF THE PREFERRED EMBODIMENT

Figure 1:
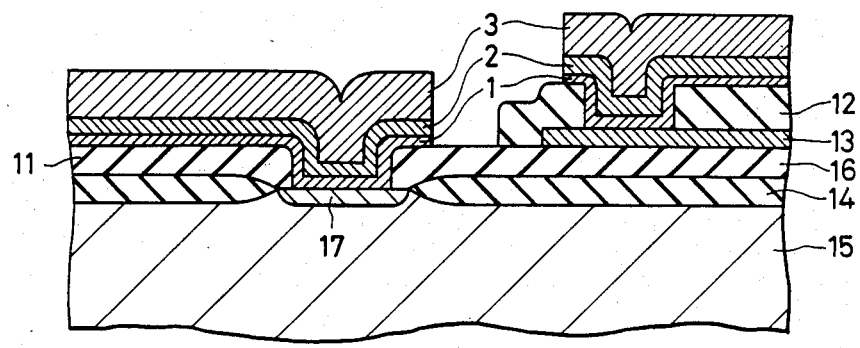
FIG. 1 is a sectional view of one embodiment of the present invention.

It has been confirmed by the examination made by the present inventors that it is considerably effective practice for solving the problem of the high contact resistance to insert a film between an Si substrate and a TiN layer, the film being made of a material having a relatively low contact resistance with both of them. However, it has been found that it is insufficient for the material for the film to merely have a relatively low contact resistance and materials which can actually be employed are limited to an extremely narrow range. For example, a film of a metal such as Ti has a relatively low contact resistance with TiN and Si and can readily be formed. However, since Ti has strong reactivity, if a heat treatment is carried out after the deposition of a wiring layer, the contact resistance is raised undesirably.

On the other hand, TiN (Ti:N=1:1) which is employed as a barrier layer is considerably stable and is less reactive with other substances. TiN$_x$ ($0.3 \leq x \leq 0.9$) which is employed in the present invention is a titanium nitride which contains excess Ti and has a certain degree of reactivity although it is not so strong as that of metallic Si. If a proper degree of reaction occurs between the above-described TiN$_x$ film on the one hand and the TiN layer as an upper layer and the silicon substrate as a lower layer on the other, it is possible to form connection which is considerably excellent from both electrical and mechanical points of view. Since there is no fear of any excessive reaction taking place, a favorably thin reaction layer is formed between the TiN$_x$ film and each of the silicon substrate and the TiN layer, so that there is only a small degree of deterioration in characteristics. As a result, considerably excellent connection having a favorably low contact resistance and an advantageously high mechanical strength is formed between the wiring layer and the substrate (an impurity-doped region).

EXAMPLE

As shown in FIG. 1, a SiO$_2$ film 14 having an opening was formed on the surface of a p-type Si substrate 15 by a known thermal oxidation method, and an n-type impurity was ion-implanted through the opening to form a doped region 17 of high impurity concentration. An insulator film 16, a polycrystalline silicon film 13 and insulator films 11, 12 were formed by known CVD, and unnecessary portions were removed as shown in FIG. 1 using a known photolithography technique.

Then, a TiN$_x$ (x=0 to 1) film 1, a TiN film 2 and an Al film 3 were formed on the whole surface in such a manner as to be successively stacked one on another.

The value of x in the TiN$_x$ film is adjusted by controlling the flow rate of N$_2$ gas and the sputter target power applied to a Ti target. More specifically, the amount by which Ti is sputtered depends on the power applied to the Ti target, while the N content in TiN$_x$ depends on the flow rate of N$_2$ gas. Therefore, it is possible to set a desired value for the above-described x by controlling the sputter target power and the flow rate of N$_2$ gas. In this way, six different kinds of TiN$_x$ layer 1 respectively having values of 0, 0.3, 0.5, 0.8, 0.9 and 1.0 for x were formed so that each layer 1 had a thickness of about 30 mm, and a TiN layer 2 having a thickness of 200 nm was formed on each of the six TiN$_x$ layers 1. Subsequently, an Al layer 3 was formed on each TiN layer 2, and the TiN$_x$ film 1, the TiN film 2 and the Al film 3 of each assembly were etched in the same pattern using a known reactive ion etching technique to form a structure such as that shown in FIG. 1 which was then subjected to a heat treatment. Thereafter, the contact resistance in the contact region between the wiring layer and the Si substrate and the leakage current in the above-described impurity-doped region were measured.

Table 1 shows the measured values for the contact resistance in the contact region between the wiring and the substrate of each of the samples in which the contact area was circular and had a diameter of 1.2 μm and the measured values for the leakage current obtained in the case where the contact area was in the shape of a square one side of which had a length of 200 μm.

TABLE 1

| Items | Impurity doped region | x 0.0 | 0.3 | 0.5 | 0.8 | 0.9 | 1.0 |
|---|---|---|---|---|---|---|---|
| Contact resistance [Ωcm$^2$] | N$^+$ layer ($2 \times 10^{20}$ P/cm$^3$) | $1 \times 10^{-7}$ | $1 \times 10^{-7}$ | $3 \times 10^{-7}$ | $3 \times 10^{-7}$ | $1 \times 10^{-6}$ | $2 \times 10^{-5}$ |
| | P$^+$ layer ($1 \times 10^{20}$ B/cm$^3$) | $5 \times 10^{-7}$ | $5 \times 10^{-7}$ | $1 \times 10^{-6}$ | $1.3 \times 10^{-6}$ | $3 \times 10^{-6}$ | $5 \times 10^{-5}$ |
| Leakage current [nA/cm$^2$] | N$^+$ layer (depth: ~0.3 μm) | 55 | 10 | 0.4 | 0.5 | 0.4 | 0.3 |
| | P$^+$ layer (depth: ~0.35 μm) | 45 | 8 | 0.5 | 0.4 | 0.2 | 0.2 |

Heat treatment at 450° C. for 5 hours

As will be understood from Table 1, the contact resistance suddenly rises as the value of x increases to approach 1. On the other hand, the leakage current suddenly increases as the value of x decreases to approach 0. It is necessary in order to form an LSI of high integration density to satisfy two conditions, that is, the contact resistance $\leq 10^{-6}$ cm$^2$ and the leakage current $\leq 10$ nA/cm, and both the conditions are met if x of TiN$_x$ is selected so as to satisfy the condition of $0.3 \leq x \leq 0.9$, thus enabling formation of a semiconductor device which is extremely low in terms of both the contact resistance and the leakage current.

Further, no separation of the TiN film was observed in the structure according to this embodiment, whereas the separation of the film has heretofore been often experienced in the conventional structure wherein the TiN layer is formed directly on Si or SiO$_2$. Thus, it has been confirmed that interposition of TiN$_x$ between both of them provides a great improvement in adhesion.

The greatest feature of the present invention resides in that, in a wiring structure using a TiN film as a barrier film, a TiN$_x$ (x=0.3 to 0.9) film is interposed between the TiN film and a silicon substrate to thereby enable a lowering in the contact resistance and prevention of separation of the wiring layer. It is, of course, possible to obtain the same advantageous effects as those described above even if the TiN$_x$ film is not disposed on the surface of the Si substrate but on an underlying wiring defined by the polycrystalline silicon film 13 as shown in FIG. 1.

The TiN$_x$ film needs to be provided under the TiN film. Since the TiN$_x$ (x=0.3 to 0.9) film is unsatisfactory in barrier effect for preventing movement of Al or Si, no excellent result is obtained if the TiN$_x$ film is interposed between a wiring such as an Al film and silicon without using a TiN film.

Since the TiN$_x$ film is not employed as a barrier film but used to improve the adhesion and lower the contact resistance, it is preferable to minimize the film thickness thereof. However, the thickness of the TiN$_x$ film is generally selected so as to fall in a range from 100 Å to 500 Å for reasons of manufacture or the like.

Selection of the thickness of the TiN film so as to fall in a range from 500 Å to 2,000 Å provides favorable results. A film thickness less than 500 Å fails to enable the TiN film to serve as an effective barrier film, whereas a film thickness in excess of 2,000 Å increases the difference in level and stress and therefore should be avoided.

The thickness of the wiring is selected to fall in a range from 0.2 μm to 2 μm. As a material for the wiring, it is, of course, possible to employ various kinds of wiring material which have heretofore been known, in addition to Al, for example, a variety of Al-based alloys containing Al as a principal component, such as Al-Si, Al-Cu Al-Cu-Si and AlTi, refractory metals such as W, Mo and Ti, and silicides of these refractory metals. Although FIG. 1 illustrates a structure in which the TiN film and the TiN$_x$ film are formed so as to extend not only through the area of contact between silicon and the wiring but also over the insulator film, it is apparent that the arrangement may be such that these layers do not extend over the insulator film but are formed only within the contact hole and the wiring layer is formed so as to extend over the insulator film alone.

What is claimed is:

1. A semiconductor device comprising:
    an insulator film having an opening formed on the surface of a semiconductor substrate, said semiconductor substrate being made of silicon;
    a TiN$_x$ (x is a value within a range from 0.3 to 0.9) film formed so as to be in contact with the surface of the silicon of said semiconductor substrate through said opening;
    a TiN film formed on said TiN$_x$ film; and
    a wiring layer formed on said TiN film.

2. A semiconductor device according to claim 1, wherein said TiN$_x$ film, said TiN film and said wiring layer are formed so as to extend over from the surface of said semiconductor substrate to the surface of said insulator film.

3. A semiconductor device according to claim 1, wherein said TiN$_x$ film and said TiN film are formed within said opening, and said wiring layer is formed so as to extend over from said opening to the surface of said insulator film.

4. A semiconductor device according to claim 1, wherein said wiring layer is a film made of a material selected from the group consisting of Al, an alloy containing Al as a principal component, W, Mo, Ti, W-silicide, Mo-silicide and Ti-silicide.

5. A semiconductor device according to claim 4, wherein said alloy containing Al as a principal component is selected from the group consisting of Al-Si alloy, Al-Cu alloy, Al-Cu-Si alloy and Al-Ti alloy.

6. A semiconductor device according to claim 1, wherein the thickness of said TiN$_x$ film is from 100 Å to 500 Å.

7. A semiconductor device according to claim 1, the thickness of said TiN film is from 500 Å to 2,000 Å.

8. A semiconductor device according to claim 1, wherein the film thickness of said wiring layer is from 0.2 μm to 2 μm.

9. A semiconductor device according to claim 1, wherein the TiN$_x$ film is directly in ohmic contact with the surface of the semiconductor substrate in said opening.

10. A semiconductor device according to claim 1, wherein the contact between the TiN$_x$ film and the surface of the semiconductor substrate has a contact resistance of less than $10^{-6}$ Ω cm$^2$ and a leakage current of less than 10 nA/cm$^2$.

11. A semiconductor device comprising:
    an insulator film having an opening formed on the surface of a semiconductor material, said semiconductor material being silicon;
    a TiN$_x$ (x is a value within a range from 0.3 to 0.9) film formed so as to be in contact with the surface of said semiconductor material through said opening;
    a TiN film formed on said TiN$_x$ film; and
    a wiring layer formed on said TiN film.

12. A semiconductor device according to claim 11, wherein said semiconductor material is polycrystalline silicon.

13. A semiconductor device according to claim 11, wherein said semiconductor material is a layer of polycrysta;;ine silicon formed over a substrate.

14. A semiconductor device according to claim 11, wherein the TiN$_x$ film forms an ohmic contact with the surface of the semiconductor material through said opening.

15. A semiconductor device according to claim 1, wherein the silicon of said semiconductor substrate, to which the TiN$_x$ film is in contact, is a doped n-region or p-region of high impurity concentration.

16. A semiconductor device according to claim 11, wherein the silicon to which the TiN$_x$ film is in contact is a doped n-region or p-region of high impurity concentration.

17. A semiconductor device comprising:
    an insulator film, having an opening, formed on the surface of a silicon material, the opening exposing at least a portion of the silicon, the silicon exposed being a doped n-region or p-region of high impurity concentration;
    a TiN$_x$ (x is a value within a range from 0.3 to 0.9) film formed so as to be in contact with the silicon exposed through said opening;
    TiN film formed on said TiN$_x$ film; and
    a wiring layer formed on said TiN film, the wiring layer being film made of a material selected from the group consisting of Al, an alloy containing Al as a principal component, W, Mo, Ti, W-silicide, Mo-silicide and Ti-silicide.

* * * * *